(12) United States Patent
Utsuno

(10) Patent No.: US 8,273,627 B2
(45) Date of Patent: Sep. 25, 2012

(54) SEMICONDUCTOR DEVICE AND METHOD FOR MANUFACTURING THEREOF

(75) Inventor: Yukihiro Utsuno, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 240 days.

(21) Appl. No.: 12/337,134

(22) Filed: Dec. 17, 2008

(65) Prior Publication Data
US 2010/0052038 A1    Mar. 4, 2010

(30) Foreign Application Priority Data
Dec. 17, 2007   (JP) ................................. 2007-325291

(51) Int. Cl.
*H01L 21/336* (2006.01)
(52) U.S. Cl. ................. 438/288; 438/259; 257/E21.578
(58) Field of Classification Search .................. 438/206; 257/E21.483, E21.532, E21.533
See application file for complete search history.

(56) References Cited

U.S. PATENT DOCUMENTS

| | | | |
|---|---|---|---|
| 6,754,105 B1 * | 6/2004 | Chang et al. | 365/185.18 |
| 6,963,108 B1 * | 11/2005 | Kang et al. | 257/330 |
| 2003/0209767 A1 * | 11/2003 | Takahashi et al. | 257/390 |
| 2005/0194627 A1 * | 9/2005 | Nomoto et al. | 257/296 |
| 2006/0160305 A1 * | 7/2006 | Mokhlesi et al. | 438/257 |
| 2006/0291281 A1 * | 12/2006 | Wang et al. | 365/185.05 |

* cited by examiner

*Primary Examiner* — Cheung Lee

(57) ABSTRACT

A semiconductor device which includes two trenches formed in a semiconductor substrate, a charge storage layer as an insulator formed on each side surface of the trenches, and separated on a bottom surface thereof, and a bit line formed below the bottom surface of the trenches in the semiconductor substrate. A channel region is formed in the semiconductor substrate from a side surface of one of the two trenches to that of the other trench via an upper surface of a protruding portion between those two trenches. A method for manufacturing the semiconductor device is also provided.

12 Claims, 9 Drawing Sheets

SEMICONDUCTOR DEVICE AND METHOD FOR MANUFACTURING THEREOF

CROSS REFERENCE TO RELATED APPLICATIONS

This application claims the priority benefit of Japanese Patent Application 2007-325291, filed Dec. 17, 2007, by the present inventor, which is hereby incorporated in its entirety.

TECHNICAL FIELD

The present invention relates to a semiconductor device and a method for manufacturing thereof, and particularly, to a semiconductor device having a trench provided with a charge storage layer formed of an insulator and a method for manufacturing thereof.

BACKGROUND ART

Recently, non-volatile semiconductor memory devices capable of retaining data even when the power is turned off have been widely used. In a typical non-volatile flash memory device, a transistor which constitutes a memory cell has a floating gate or an insulating film which is called a charge storage layer. Data is stored by accumulating charges in the charge storage layer. The flash memory with the insulating film as the charge storage layer has a SONOS (Silicon Oxide Nitride Oxide Silicon) structure where the charge is accumulated in the charge storage layer inside the ONO (oxide film/nitride film/oxide film) film. A SONOS type flash memory with a virtual ground type memory cell that exchanges the source and drain to realize symmetrical operations has been disclosed. The use of this type of flash memory allows the storage of 2 bits of data in a memory cell.

Japanese Unexamined Patent Application Publication No. 2005-116964 (Document 1) discloses a non-volatile memory having a charge storage layer formed on a side surface of a trench, and an impurity region formed on an upper surface of a semiconductor substrate between trenches. Japanese Unexamined Patent Application No. 2005-136426 (Document 2) discloses a non-volatile memory having a charge storage layer on a side surface of a trench, and an impurity region formed on a bottom surface of the trench and on an upper surface of a semiconductor substrate between the trenches.

The non-volatile memory as disclosed in Documents 1 and 2 has the charge storage layer formed on the side surface of the trench, and accordingly, the resultant memory cell may be miniaturized. However, in the non-volatile memory disclosed in Document 1, the impurity region as the bit line has its bottom surface in contact with the channel region. Therefore, the electric field between the channel region and the bit line is small, failing to improve writing and erasing features.

The non-volatile memory as disclosed in Document 2 allows the charge storage layer formed on one side surface of the trench to store 2-bit data. This may result in interference in the charge accumulated in the charge storage layer.

SUMMARY OF THE INVENTION

It is an object of the present invention to provide a semiconductor device with excellent writing and erasing features, which is capable of suppressing interference in the charge accumulated in the charge storage layer, and a method for manufacturing the semiconductor device.

According to an aspect of the present invention, there is provided a semiconductor device which includes two trenches formed in a semiconductor substrate. A charge storage layer formed of an insulator, is provided on each side surface of the two trenches, and separated on each bottom surface of the two trenches. A bit line is formed below each bottom surface of the two trenches inside the semiconductor substrate. A channel region is formed in the semiconductor substrate from one side surface of one of the two trenches to that of the other trench via an upper surface of a protruding portion formed between the two trenches. In the present invention, the electric field around the interfacial surface between the bit line and the channel region is steeply intensified upon writing and erasing operations so as to improve those writing and erasing features. As the charge storage layer formed of the insulator is separated on the bottom of the trench, the interference of the charge accumulated in the charge storage layer may be suppressed.

In the structure mentioned above, the bit line is provided apart from the respective side surfaces of each of the two trenches. This makes it possible to improve the writing and erasing features.

In the aforementioned structure, each of the bit lines is defined by the charge storage layer separated on each of the bottom surfaces of the two trenches. This makes it possible to prevent the writing and erasing features from varying.

According to another aspect of the present invention, there is provided a method for manufacturing a semiconductor device. The steps include: forming two trenches in a semiconductor substrate, a charge storage layer as an insulator separated on each bottom surface of the two trenches on each side surface of the two trenches, and a bit line below each bottom surface of the two trenches inside the semiconductor substrate. A channel region is formed in the semiconductor substrate from one side surface of one of the two trenches to that of the other trench via an upper surface of a protruding portion formed between the two trenches. This makes it possible to improve the writing and erasing features, and suppress interference of the charge accumulated in the charge storage layer.

The method further includes a step of forming a sidewall layer on a side surface of the charge storage layer formed on each side surface of the two trenches. The step of forming the charge storage layer includes a step of eliminating the charge storage layer formed on each bottom surface of the two trenches using the sidewall layer as a mask. This makes it possible to form the bit line apart from each end of the bottom surface of the trench.

In the aforementioned method, the step of forming the bit line includes forming the bit line using the sidewall layer as the mask. This makes it possible to form the charge storage layer and the bit line in a self-aligning manner.

According to the method mentioned above, the step of forming the two trenches includes forming the two trenches using a mask layer formed on the semiconductor substrate as the mask. The step of forming the charge storage layer includes forming the charge storage layer on an inner surface of the two trenches, and side and upper surfaces of the mask layer. The step of forming the sidewall layer includes forming the sidewall layer on the side surfaces of the two trenches and the charge storage layer formed on the side surface of the mask layer. This structure makes it possible to prevent the writing and erasing features from varying.

The aforementioned method further includes a step of polishing the mask layer to eliminate the mask layer.

In the aforementioned method, the mask layer is formed on the semiconductor substrate via a protection layer; the method further includes a step of selectively eliminating the mask layer with respect to the protection layer.

According to the aforementioned method, the step of forming the two trenches includes forming the two trenches using the mask layer formed on the semiconductor substrate as the mask. The step of forming the charge storage layer includes forming the charge storage layer on each inner surface of the two trenches after eliminating the mask layer.

DETAILED DESCRIPTION

Figure 1:
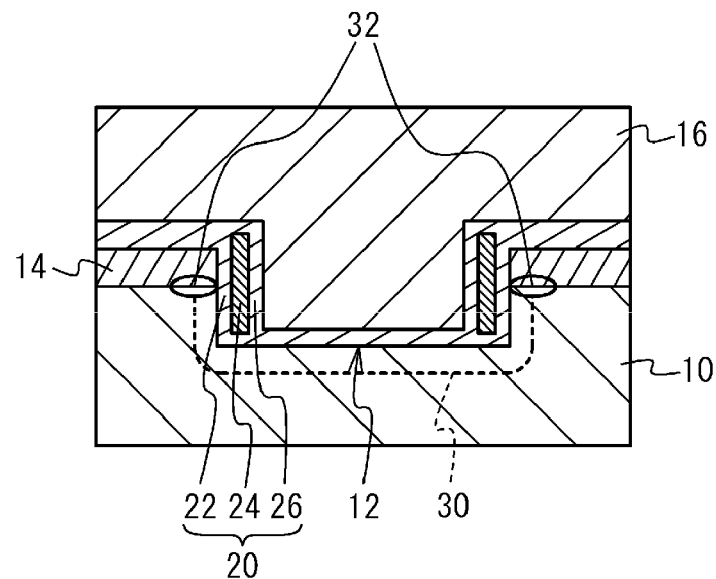
FIG. 1 is a sectional view (part 1) of a prior art non-volatile memory.

The problems of the non-volatile memory as disclosed in Documents 1 and 2 will be described with reference to the drawings. FIG. 1 is a sectional view of the non-volatile memory described in Document 1. Referring to FIG. 1, a trench 12 is formed in a semiconductor substrate 10. Bit lines 14 each formed of a diffusion region are formed at each side of the trench 12 on an upper surface of the semiconductor substrate 10. An ONO film 20 formed of a tunnel insulating film 22, a charge storage layer 24 and a top insulating film 26 is formed on each side surface of the trench 12. A word line 16 serving as a gate electrode is formed in the trench 12.

When a voltage is applied between the bit lines 14 at the respective sides of the trench 12, to apply a positive voltage to the word line 16 serving as the gate electrode, a channel region 30 is formed within the semiconductor substrate 10 below the inner surface of the trench 12, as shown in FIG. 1. The charge storage layers 24 formed at the respective side surfaces of the trench 12 allow storage of 1-bit data. Because the bit line 14 is the diffusion region formed through the ion implantation process, the profile of the impurity which has been ion implanted has a gentle profile on each bottom surface 32. As a result, the electric field around the interfacial surface between the bit line 14 and the channel region 30 cannot be intensified, thus failing to improve the writing and erasing features in the non-volatile memory as disclosed in Document 1.

Figure 2:
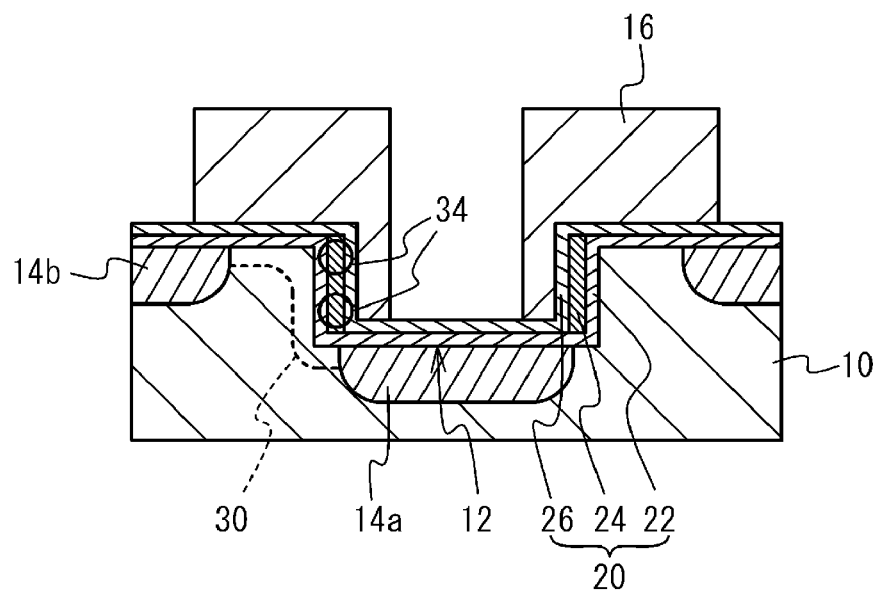
FIG. 2 is a sectional view (part 2) of another prior art non-volatile memory.

FIG. 2 is a sectional view of the non-volatile memory as disclosed in Document 2. A bit line 14a is formed inside the semiconductor substrate 10 below the bottom surface of the trench 12, and bit lines 14b are formed below the upper surface of the semiconductor substrate 10 at each side of the trench 12. A channel region 30 is formed along a side surface of the trench 12 between the bit lines 14a and 14b. A charge storage layer 24 is integrally formed on the side surface of the trench 12. The 1-bit data may be stored in each of two regions 34 inside the single charge storage layer 24. It is therefore difficult to remove the charge storage layer 24 between those two regions 34. The charges accumulated in the two regions 34 of the charge storage layer 24 may interfere with each other.

Embodiments of the present invention intended to solve the problems of the non-volatile memory as disclosed in Documents 1 and 2 will be described with reference to the drawings.

First Embodiment

Figure 3:
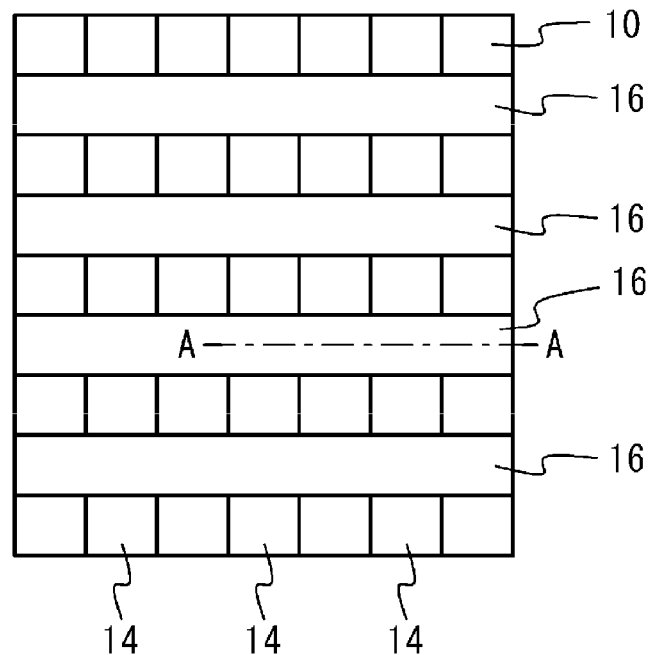
FIG. 3 is a top view of a non-volatile memory according to a first embodiment.
Figure 4:
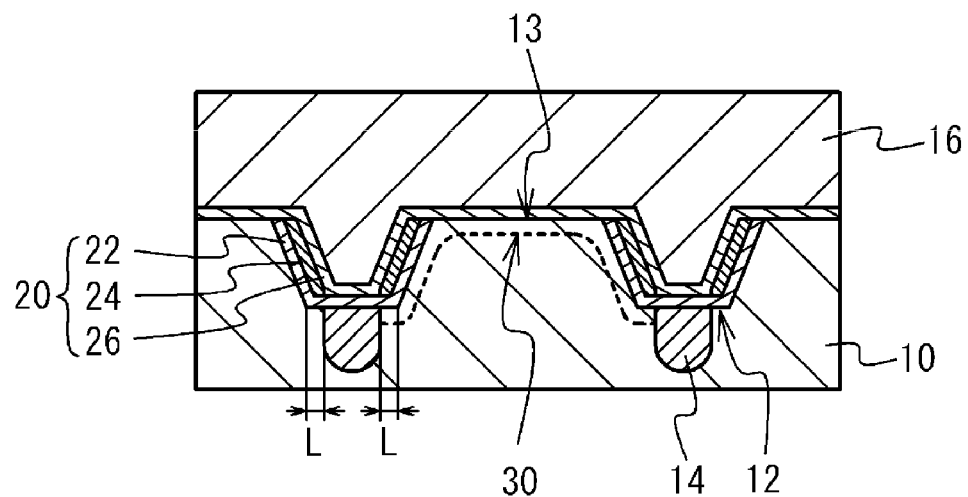
FIG. 4 is a sectional view taken along line A-A shown in FIG. 3.

FIG. 3 is a top view of a non-volatile memory according to a first embodiment of the present invention (ONO film is not shown). FIG. 4 is a sectional view taken along line A-A shown in FIG. 3. Referring to FIG. 3, a plurality of bit lines 14 extend within a semiconductor substrate 10. A plurality of word lines 16 are also formed on the semiconductor substrate 10 so as to extend crossing the bit lines 14.

Referring to FIG. 4, two trenches 12 are formed in a p-type silicon semiconductor substrate (or p-type region inside the semiconductor substrate) 10. The bit lines 14, each of a n-type diffusion region, are formed below each bottom surface of the trenches 12 in the semiconductor substrate 10. An ONO film 20 formed of a tunnel insulating film 22, a charge storage layer 24 and a top insulating film 26 is formed on each side surface of the two trenches 12. The charge storage layer 24 of the ONO film 20 is separated on the bottom surface of the trench 12. A word line 16 formed of a conductor such as a polysilicon serving as a gate electrode is formed on the semiconductor substrate 10 to fill the trench 12.

When voltage is applied between the bit lines 14 below the two trenches 12 and the positive voltage is applied to the word line 16 serving as the gate electrode, a channel region 30 is formed in the semiconductor substrate 10 from a side surface of one of those two trenches 12 to that of the other trench 12 via an upper surface of a protruding portion 13 between the trenches 12. A side surface of the bit line 14 is in contact with the channel region 30. As the bit line 14 is formed through the ion implantation process from above, the impurity profile around the side surface of the bit line 14 becomes steep. Accordingly, the electric field around the interfacial surface between the bit line 14 and the channel region 30 becomes steep upon writing and erasing operations. This makes it possible to improve the writing and erasing features.

The ONO film 20 is separated on the bottom surface of the trench 12. This makes it possible to suppress the interference between charges accumulated in the separated ONO film 20.

The bit lines 14 are disposed apart from each side surface of the two trenches 12 by a distance L. This makes it possible to intensify the electric field between the bit line 14 and the channel region 30, thus improving the writing and erasing features.

Figure 5A:
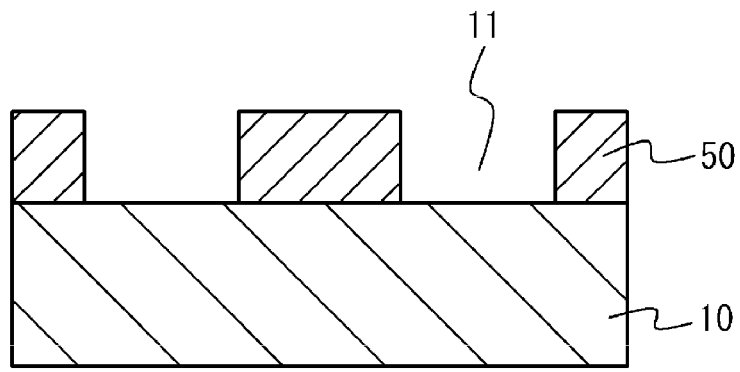
FIGS. 5A, 5B, and 5C are sectional views (part 1) each showing a manufacturing step of the non-volatile memory according to the first embodiment, corresponding to the sectional view taken along line A-A shown in FIG. 3.

A method for manufacturing the non-volatile memory according to the first embodiment will be described referring to FIGS. 5A to 7B. Referring to FIG. 5A, a hard mask 50, for example a silicon nitride film, is formed on the silicon semiconductor substrate 10. The hard mask 50 has an opening 11 for forming the trench 12.

Figure 5B:
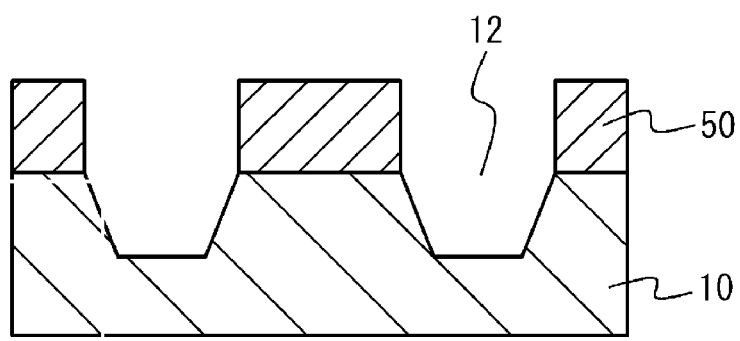
Figure 5C:
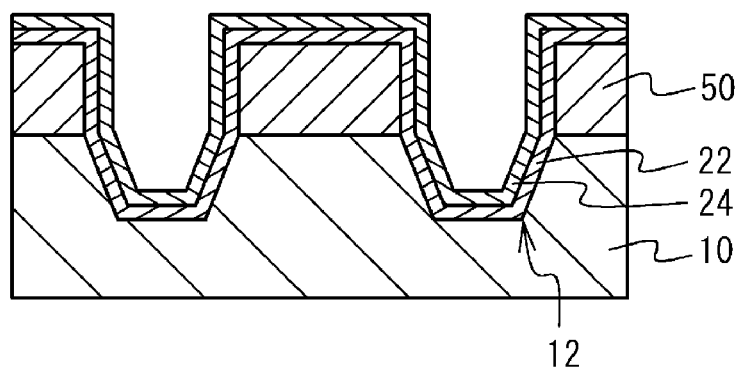

Referring to FIG. 5B, the trench 12 is formed in the semiconductor substrate 10 using the hard mask 50 as a mask. The trench 12 has a depth of 100 nm and a width of 60 nm, and the interval between the trenches 12 is 60 nm, for example. The trench 12 has slope-like side surfaces. Referring to FIG. 5C, a tunnel insulating film 22 formed of, for example, a silicon oxide film, and a charge storage layer 24 formed of, for example, a silicon nitride film are formed to cover the inner surface of the trench 12, and side and upper surfaces of the hard mask 50.

Figure 6A:
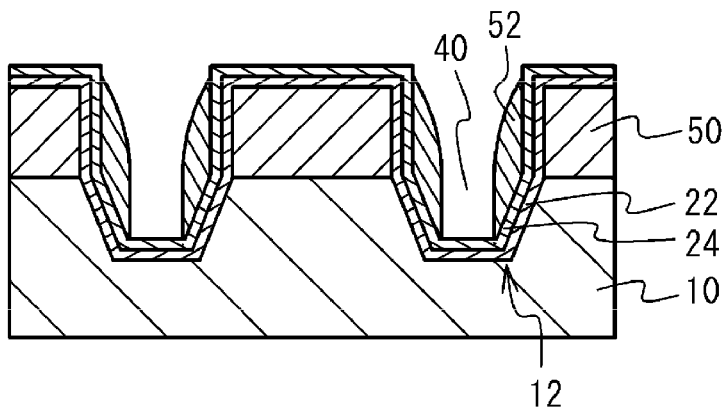
FIGS. 6A, 6B, and 6C are sectional views (part 2) each showing a manufacturing step of the non-volatile memory according to the first embodiment, corresponding to the sectional view taken along line A-A shown in FIG. 3.

Referring to FIG. 6A, a polymer film formed in a dry etching device using etching gas is applied onto the inner surface of the trench 12, and the side and upper surfaces of the hard mask 50. The polymer film is formed of carbon, fluorine, hydrogen and the like, and subjected to an anisotropic etching from above. A polymer sidewall layer 52 is formed on the side surface of the charge storage layer 24 on each side surface of the two trenches 12.

Figure 6B:
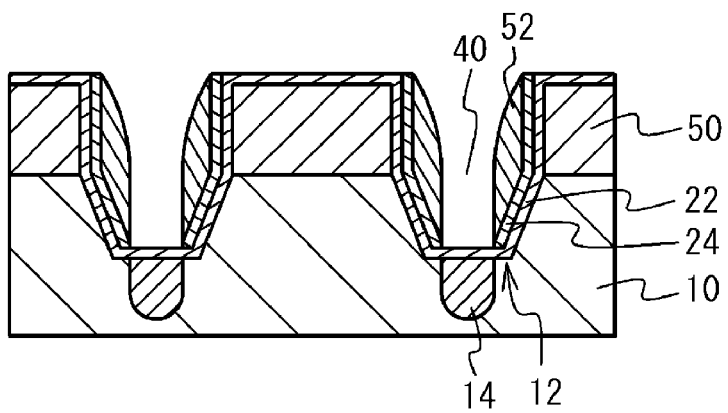

Referring to FIG. 6B, the charge storage layers 24 formed on each bottom surface of the two trenches 12 and on the hard mask 50 are eliminated using the sidewall layer 52 as the mask. The impurity such as arsenic is ion implanted into the semiconductor substrate 10 using the sidewall layer 52 as the mask to form the bit line 14. The impurity is not ion implanted into the semiconductor substrate 10 between the trenches 12 in the presence of the hard mask 50. The bit line 14, thus, is defined by the charge storage layers 24.

Figure 6C:
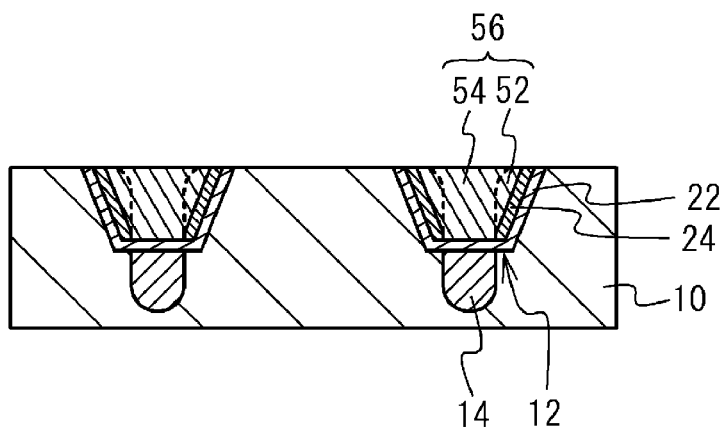

Referring to FIG. 6C, the trench 12 is filled with a bury layer 54 formed of a polymer. The hard mask 50 and the polymer are polished through a CMP (Chemical Mechanical Polish) process so as to expose the semiconductor substrate 10 between the two trenches 12. Accordingly, the hard mask 50 is eliminated, and the trench 12 is filled with a layer 56 including the sidewall layer 52 and the bury layer 54.

Figure 7A:
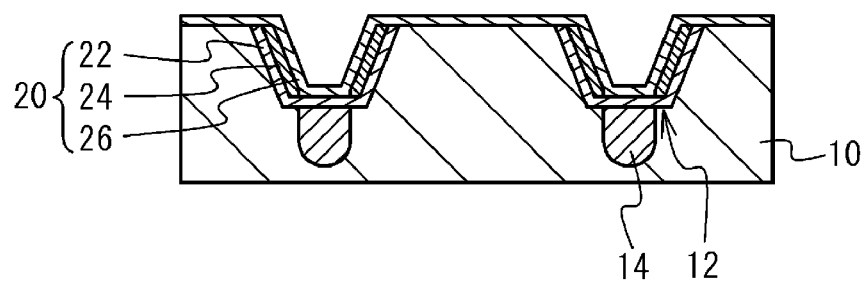
FIGS. 7A and 7B are sectional views (part 3) each showing a manufacturing step of the non-volatile memory according to the first embodiment corresponding to the sectional view taken along line A-A shown in FIG. 3.
Figure 7B:
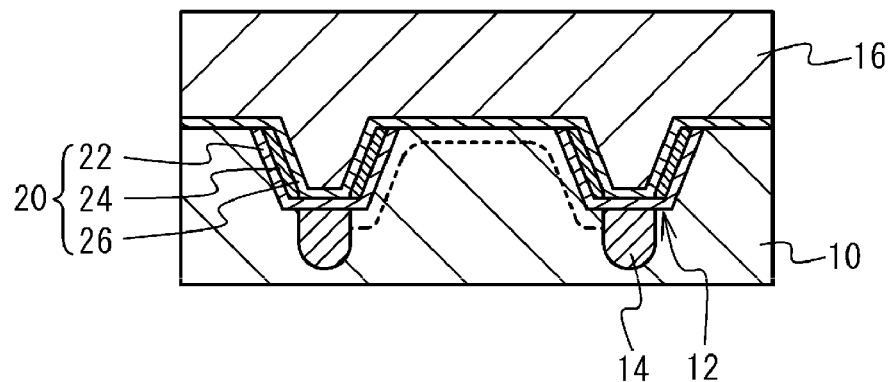

Referring to FIG. 7A, the layer 56 is eliminated and a top insulating film 26 as the silicon oxide film is formed to cover the charge storage layer 24 such that the ONO film 20 is formed on the side surface of the trench 12. Referring to FIG. 7B, a conductive polysilicon film is formed on the top insulating film 26, and the word line 16 across the bit lines 14 is formed by eliminating the predetermined region. Thereafter, an inter-layer insulating film and an interconnection layer are formed to finish producing the non-volatile memory according to the first embodiment.

According to the first embodiment, the sidewall layer 52 is formed on each side surface of the charge storage layers 24 on the side surfaces of the two trenches 12, respectively. Then the charge storage layers 24 formed on the bottom surfaces of the two trenches 12 are eliminated using the sidewall layer 52 as the mask as shown in FIG. 6B. This makes it possible to form the bit line 14 apart from each end of the bottom surface of the trench 12.

As the bit line 14 is formed using the sidewall layer 52 as the mask as shown in FIG. 6B, the charge storage layer 24 and the bit line 14 may be formed in a self-aligning manner.

As shown in FIG. 5B, the trench 12 is formed using the hard mask 50 that is formed as the mask layer on the semiconductor substrate 10. As shown in FIG. 5C, the charge storage layer 24 is formed on the inner surface of the trench 12, and the side and upper surfaces of the hard mask 50. As shown in FIG. 6A, the sidewall layer 52 is formed on the side surface of the charge storage layer 24. The charge storage layer 24 is formed on the side surfaces of the trench 12 and the hard mask 50. As shown in FIG. 6B, the charge storage layer 24 is separated, and the bit line 14 is formed using the sidewall layer 52 as the mask. This makes it possible to separate the charge storage layer 24 and to form the bit line 14 in a self-aligning manner with the trench 12. Because the positional relationship between the bit line 14 and the charge storage layer 24 influences the writing and erasing features, according to the first embodiment, the bit line 14 is defined by the charge storage layers 24 on each corresponding bottom surface of the two trenches 12.

Second Embodiment

Figure 8A:
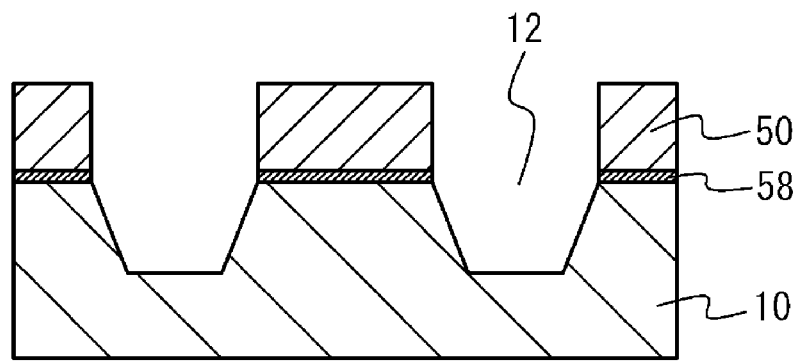
FIGS. 8A, 8B, and 8C are sectional views (part 1) each showing a manufacturing step of a non-volatile memory according to a second embodiment, corresponding to the sectional view taken along line A-A shown in FIG. 3.

A process for producing the non-volatile memory according to the second embodiment will be described referring to FIGS. 8A to 9C. Referring to FIG. 8A, a protection layer 58 formed of the silicon oxide film having an opening, and the hard mask 50, are formed on the semiconductor substrate 10. The trench 12 is formed in the semiconductor substrate 10 using the hard mask 50 as the mask.

Figure 8B:
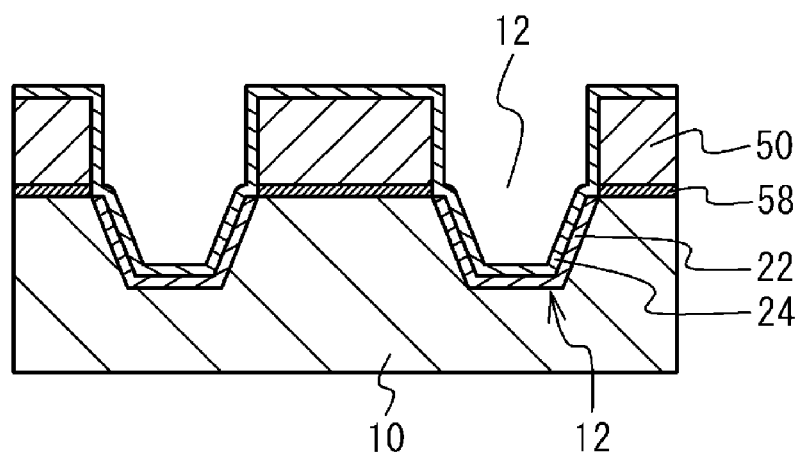

Referring to FIG. 8B, the tunnel insulating film 22, formed of the silicon oxide film, is formed on the inner surface of the trench 12 through a direct oxidation process such as the thermal oxidation process. The hard mask 50, formed of the silicon nitride film, receives very little of the silicon oxide film on the surface of the hard mask 50. The charge storage layer 24 is formed to cover the tunnel insulating film 22 on the inner surface of the trench 12, and the side and upper surfaces of the hard mask 50.

Figure 8C:
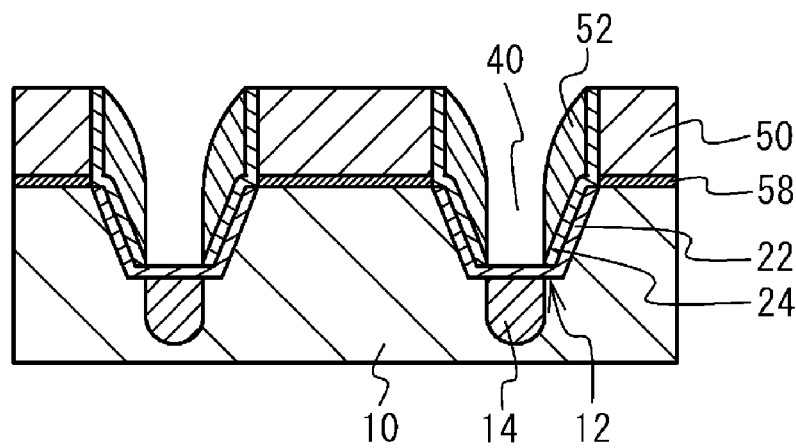

Referring to FIG. 8C, the charge storage layer 24 on the bottom surface of the trench 12 is separated through the same process as the one described in the first embodiment shown in FIG. 6B. The bit line 14 is formed below the bottom surface of the trench 12 inside the semiconductor substrate 10.

Figure 9A:
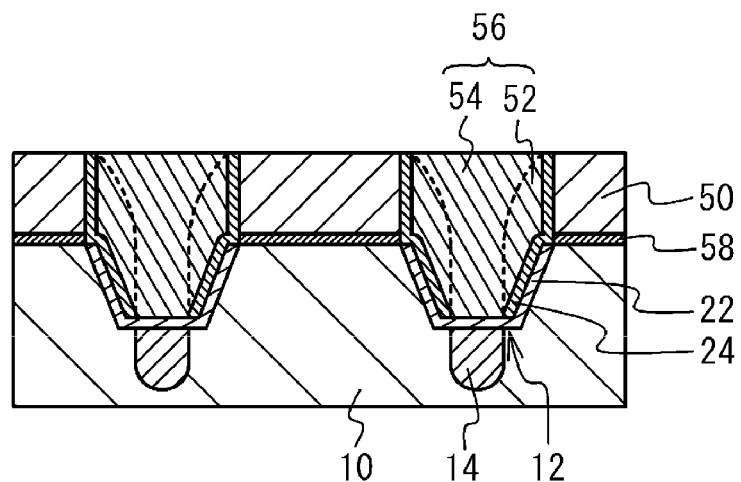
FIGS. 9A, 9B and 9C are sectional views (part 2) each showing a manufacturing step of the non-volatile memory according to the second embodiment, corresponding to the sectional view taken along line A-A shown in FIG. 3.

Referring to FIG. 9A, the trench 12 is filled with a bury layer 54, formed of polymer, such that a polymer layer 56 including the sidewall layer 52 and the bury layer 54 is formed.

Figure 9B:
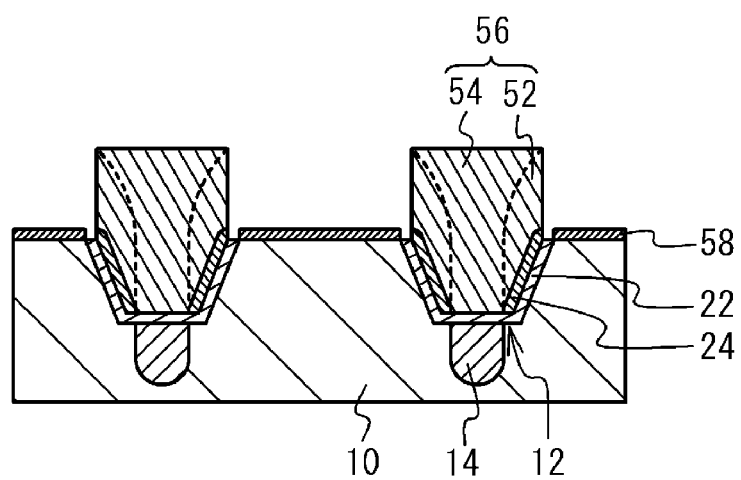

Referring to FIG. 9B, the hard mask 50 is eliminated. The charge storage layer 24 formed on the side surface of the layer 56 is also eliminated. The charge storage layer 24, was formed from the same material as the hard mask 50.

Figure 9C:
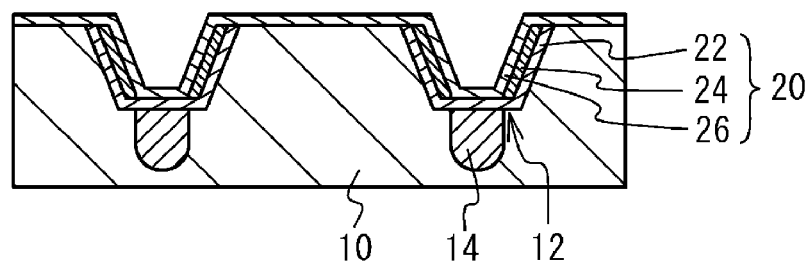

Referring to FIG. 9C, the layer 56 is eliminated. The top insulating film 26 is formed to cover the charge storage layer 24 formed on the side surface of the trench 12, the tunnel insulating film 22 on the bottom surface of the trench 12, and the semiconductor substrate 10 between the trenches 12. Thereafter, the same process as described in the first embodiment shown in FIG. 7B is performed to finish the producing process according to the second embodiment.

As described in the first and second embodiments, preferably, the sidewall layer 52 is formed of a polymer material which is different from the material for forming the charge storage layer 24. This makes it possible to selectively eliminate the layer 56 with respect to the charge storage layer 24, as shown in FIG. 7A in the first embodiment and FIG. 9C in the second embodiment, thus suppressing damage exerted to the charge storage layer 24.

The hard mask 50 may be eliminated through the CMP process as described in the first embodiment shown in FIG. 6C, or by etching as described in the second embodiment shown in FIG. 9B.

In the first embodiment, the hard mask 50 is easily eliminated through polishing as shown in FIG. 6C. However, the polishing may damage the semiconductor substrate 10 where the channel region forms. Meanwhile, in the second embodiment, the hard mask 50 is formed on the semiconductor substrate 10 via the protection layer 58 therebetween, as shown in FIG. 8A. The hard mask 50 is selectively eliminated with respect to the protection layer 58 as shown in FIG. 9B. As the protection layer 58 protects the upper surface of the semiconductor substrate 10, the damage exerted to the channel region may be suppressed.

Third Embodiment

Figure 10A:
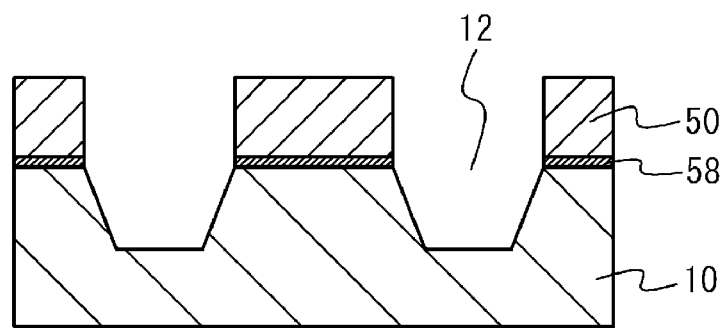
FIGS. 10A, 10B, and 10C are sectional views (part 1) each showing a manufacturing step of a non-volatile memory according to a third embodiment, corresponding to the sectional view taken along line A-A shown in FIG. 3.
Figure 10B:
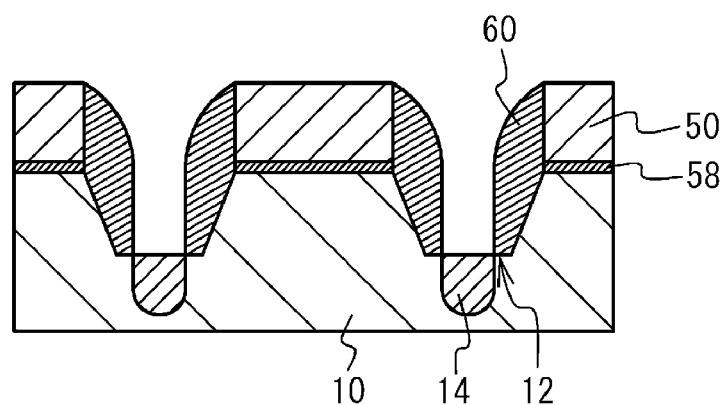

A third embodiment is an example where the bit line is formed before forming the charge storage layer. The process for producing the non-volatile memory according to the third embodiment will be described referring to FIGS. 10A to 11B. Referring to FIG. 10A, the same process as the one described in the second embodiment shown in FIG. 8A is performed. Referring to FIG. 10B, a polymer sidewall layer 60 is formed on the side surfaces of the trench 12 and the hard mask 50. The bit line 14 is formed below the bottom surface of the trench 12 using the sidewall layer 60 and the hard mask 50 as the mask.

Figure 10C:
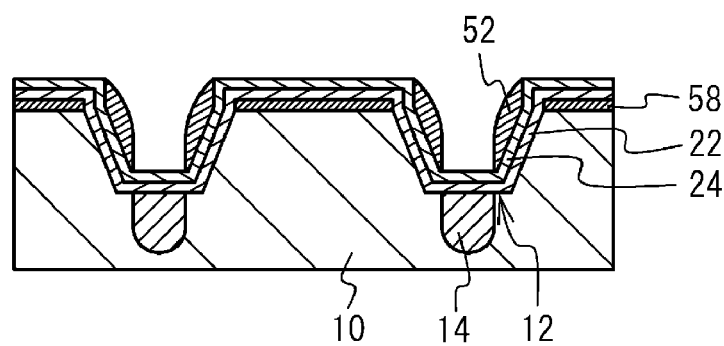

Referring to FIG. 10C, the sidewall layer 60 and the hard mask 50 are eliminated, and at the same time, the surface of the semiconductor substrate 10 is protected by the protection layer 58. The tunnel insulating film 22 and the charge storage layer 24 are formed on the inner surface of the trench 12 and the semiconductor substrate 10 between the trenches 12. The polymer sidewall layer 52 is formed to be in contact with the charge storage layer 24 on the side surface of the trench 12.

Figure 11A:
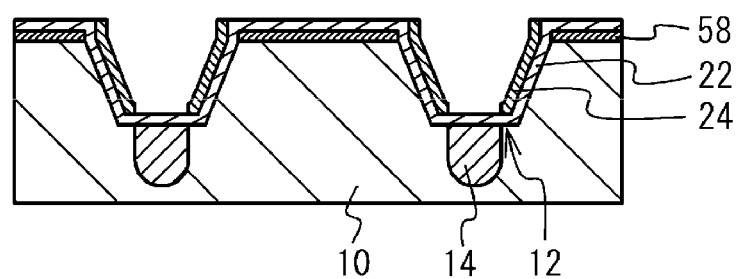
FIGS. 11A and 11B are sectional views (part 2) each showing a manufacturing step of the non-volatile memory according to the third embodiment, corresponding to the sectional view taken along line A-A shown in FIG. 3.

Referring to FIG. 11A, the charge storage layers 24 formed on the bottom surface of the trench 12 and on the semiconductor substrate 10 between the trenches 12 are eliminated using the sidewall layer 52 as the mask.

Figure 11B:
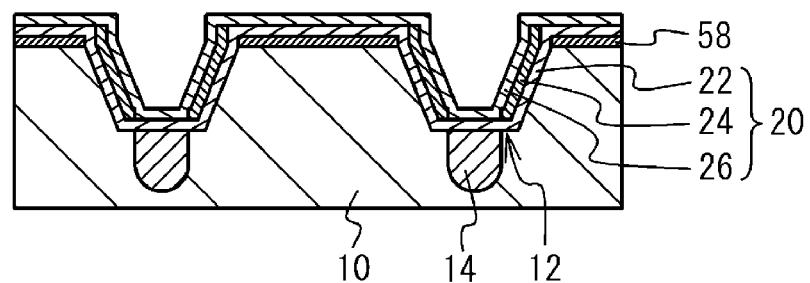

Referring to FIG. 11B, the sidewall layer 52 is eliminated, and the top insulating film 26 is formed. Thereafter, the same process as described in the first embodiment shown in FIG. 7B is performed to finish producing the non-volatile memory according to the third embodiment.

In the second embodiment, the charge storage layer 24 formed of the silicon nitride film is formed on the side surface of the hard mask 50 as shown in FIG. 8B. Referring to FIG. 9B, when the side surface of the hard mask 50 is tapered upon dry etching of the hard mask 50 and the charge storage layer 24, the upper surface of the polymer layer 56 may be flared. As a result, a thread-like residual film from the charge storage layer 24 is likely to remain. After eliminating the polymer layer 56 as shown in FIG. 9C, the residual thread-like film is generated. In the third embodiment, the charge storage layer 24 is formed on the inner surface of the trench 12 after eliminating the hard mask 50 as shown in FIG. 10C. This makes it possible to suppress generation of the thread-like residual film.

While the preferred embodiments of the present invention have been described in details above, the invention is not limited to those specific embodiments and, within the spirit and scope of the invention as defined in the appended claims, various modifications and alterations may be made.

The invention claimed is:

1. A semiconductor device comprising:
two trenches formed in a semiconductor substrate, wherein each side surface of the two trenches is sloped;
a charge storage layer as an insulator formed on each of the sloped side surfaces of the two trenches, wherein each sloped side surface of the two trenches has a separate charge storage layer, wherein the charge storage layers are separated from each other by the bottom surfaces of the two trenches, and wherein each charge storage layer extends substantially an entire length of a corresponding sloped side surface; and
a bit line formed only below the bottom surface of each one of the two trenches inside the semiconductor substrate, wherein the bit lines are separated from respective side surface edges of each of the two trenches, wherein a channel region is formed in the semiconductor substrate from one side surface of one of the two trenches to that of the other trench via an upper surface of a protruding portion formed between the two trenches.

2. The semiconductor device according to claim 1, wherein each one of the bit lines is defined by the charge storage layers which are separated from each other by the bottom surfaces of the two trenches.

3. The semiconductor device according to claim 1, wherein the bit line is only formed between the respective side surfaces of each of the two trenches.

4. A method for manufacturing a semiconductor device comprising:
forming two trenches in a semiconductor substrate, wherein each side surface of the two trenches is sloped;
forming a charge storage layer as an insulator on each of the sloped side surfaces of the two trenches, wherein each sloped side surface of the two trenches has a separate charge storage layer, wherein the charge storage layers are separated from each other by the bottom surfaces of the two trenches, and wherein each charge storage layer extends substantially an entire length of a corresponding sloped side surface; and
forming a bit line only below each bottom surface of the two trenches inside the semiconductor substrate, wherein the bit lines are separated from respective side surface edges of each of the two trenches, wherein a channel region is formed in the semiconductor substrate from one side surface of one of the two trenches to that of the other trench via an upper surface of a protruding portion formed between the two trenches.

5. The method for manufacturing a semiconductor device according to claim 4, further comprising forming a sidewall layer on a side surface of the charge storage layer formed on each side surface of the two trenches, wherein the step of forming the charge storage layer includes eliminating the charge storage layer formed on each bottom surface of the two trenches using the sidewall layer as a first mask.

6. The method for manufacturing a semiconductor device according to claim 5, wherein the bit line is formed using the sidewall layer as the first mask.

7. The method for manufacturing a semiconductor device according to claim 6, wherein the bit line is only formed between the respective side surfaces of each of the two trenches.

8. The method for manufacturing a semiconductor device according to claim 5, wherein:
the two trenches are formed using a mask layer formed on the semiconductor substrate as a second mask;
the charge storage layer is formed on an inner surface of the two trenches and on side and upper surfaces of the mask layer; and
the sidewall layer is formed on the side surfaces of the two trenches.

9. The method for manufacturing a semiconductor device according to claim 8, further comprising polishing the mask layer to eliminate the mask layer.

10. The method for manufacturing a semiconductor device according to claim 8, wherein the mask layer is formed on the semiconductor substrate via a protection layer.

11. The method for manufacturing a semiconductor device according to claim 10, further comprising selectively eliminating the mask layer with respect to the protection layer.

12. The method for manufacturing a semiconductor device according to claim 5, wherein:

the step of forming the two trenches includes using a mask layer formed on the semiconductor substrate as a second mask; and the step of forming the charge storage layer includes forming the charge storage layer on each inner surface of the two trenches after eliminating the mask layer.

\* \* \* \* \*